US011830733B2

(12) United States Patent
Mangum et al.

(10) Patent No.: US 11,830,733 B2
(45) Date of Patent: Nov. 28, 2023

(54) PATTERNED NANOCHANNEL SACRIFICIAL LAYER FOR SEMICONDUCTOR SUBSTRATE REUSE

(71) Applicant: Alliance for Sustainable Energy, LLC, Golden, CO (US)

(72) Inventors: John Stanley Mangum, Englewood, CO (US); William Edwin Mcmahon, Denver, CO (US); Emily Lowell Warren, Golden, CO (US); San Theingi, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/656,762

(22) Filed: Mar. 28, 2022

(65) Prior Publication Data
US 2022/0310389 A1    Sep. 29, 2022

Related U.S. Application Data

(60) Provisional application No. 63/166,418, filed on Mar. 26, 2021.

(51) Int. Cl.
*H01L 21/02* (2006.01)
*H01L 21/78* (2006.01)

(52) U.S. Cl.
CPC .. *H01L 21/02496* (2013.01); *H01L 21/02395* (2013.01); *H01L 21/02463* (2013.01); *H01L 21/7813* (2013.01)

(58) Field of Classification Search
CPC ... H01L 21/00; H01L 21/02; H01L 21/02104; H01L 21/02365; H01L 21/02367; H01L 21/02395; H01L 21/02428; H01L 21/0243; H01L 21/02433; H01L 21/02463; H01L 21/02496; H01L 21/02546; H01L 21/0259; H01L 21/02639; H01L 21/0265; H01L 21/04; H01L 21/12; H01L 21/18; H01L 21/20; H01L 21/2006; H01L 21/205; H01L 21/207; H01L 21/29; H01L 21/7806; H01L 21/7813; H01L 29/00; H01L 29/02;
(Continued)

(56) References Cited

U.S. PATENT DOCUMENTS

| | | | |
|---|---|---|---|
| 2010/0026779 A1* | 2/2010 | Yonehara | B41J 2/45 438/34 |
| 2014/0120656 A1* | 5/2014 | Song | H01L 31/06875 438/94 |
| 2022/0165570 A1* | 5/2022 | Kamikawa | H01L 21/02458 |

FOREIGN PATENT DOCUMENTS

WO    91/17565    11/1991

OTHER PUBLICATIONS

Voncken, et al., Multiple release layer study of the intrinsic lateral etch rate of the epitaxial lift-off process, Appl. Phys. A, 79, 1801-1807 (Year: 2004).*

(Continued)

*Primary Examiner* — Jonathan Han
(74) *Attorney, Agent, or Firm* — Neal Vickery

(57) ABSTRACT

Described herein are systems and methods of utilizing nanochannels generated in the sacrificial layer of a semiconductor substrate to increase epitaxial lift-off speeds and facilitate reusability of GaAs substrates. The provided systems and methods may utilize unique nanochannel geometries to increase the surface area exposed to the etchant and further decrease etch times.

16 Claims, 4 Drawing Sheets

(58) Field of Classification Search
CPC ....... H01L 29/04; H01L 29/045; H01L 29/12; H01L 29/20; H01L 29/2006; H01L 29/201
See application file for complete search history.

(56) References Cited

OTHER PUBLICATIONS

Lager, et al., Crystal structure and thermal expansion of α-quartz SiO2 at low temperatures, Journal of Applied Physics 53, 6751 (Year: 1982).*
Cheng, C-W et al., "Epitaxial lift-off process for gallium arsenide substrate reuse and flexible electronics," Nature Communications, Mar. 12, 2013, 7 pages.
Schermer, J.J. et al., "High rate epitaxial lift-off of InGaP films from GaAs substrates," Applied Physics Letters, vol. 76, No. 15, 2000, 3 pages.
Voncken, M.M.A.M. et al., "Multiple release layer study of the intrinsic lateral etch rate of the epitaxial lift-off process," Applied Physica A, vol. 79, 2004, 7 pages.
Yablonovitch, E. et al., "Extreme selectivity in the lift-off of epitaxial GaAs films," Applied Physics Letters, vol. 51, No. 26, Dec. 28, 1987, 3 pages.
Yoon, J. et al., "GaAs photovoltaics and optoelectronics using releasable multilayer epitaxial assemblies," Nature Letters, vol. 465, May 20, 2010, 6 pages.
Youtsey, C. et al., "Epitaxial lift-off for III-nitride devices," Semiconductors and Semimetals, Elsevier, vol. 102, Chapter 13, 2019, 48 pages.

\* cited by examiner

PATTERNED NANOCHANNEL SACRIFICIAL LAYER FOR SEMICONDUCTOR SUBSTRATE REUSE

CROSS-REFERENCE TO RELATED APPLICATIONS

This application claims priority from U.S. Provisional Patent Application No. 63/166,418, filed on Mar. 26, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

Described herein are systems and methods of utilizing nanochannels generated in the sacrificial layer of a semiconductor substrate to increase epitaxial lift-off speeds and facilitate reusability of GaAs substrates. The provided systems and methods may utilize unique nanochannel geometries to increase the surface area exposed to the etchant and further decrease etch times.

In an aspect, provided is a method for generating a sacrificial layer for semiconductor production comprising: a) providing a GaAs substrate having a nanochannel mask in physical communication with a surface; and b) depositing a $Al_xGa_{1-x}As$ sacrificial material on the surface of the GaAs substrate, thereby generating a sacrificial layer comprising a plurality of nanochannels.

The described method may further comprise: c) growing a semiconductor device on a first surface of the sacrificial layer; and d) removing the semiconductor device by applying physical force to the semiconductor device and chemical etchant to the sacrificial layer, wherein the plurality of nanochannel increase a rate of chemical etching.

The plurality of nanochannels may have a characteristic height dimension greater than a characteristic width dimension. The characteristic vertical dimension may be at least 1.1×, 1.25× 1.5×, 1.75×, 2× or 3× greater than the characteristic width dimension. The width dimension may selected from the range of 1 nm to 1000 nm, 50 nm to 500 nm, 500 to 1000 nm, 250 nm to 500 nm, or optionally, 200 nm to 400 nm.

The plurality of nanochannels may increase a surface area of a second surface of the sacrificial layer by greater than 25%, 50%, 75%, or optionally, 100% with respect to a flat surface not containing nanochannels. The x in the formula $Al_xGa_{1-x}As$ is selected from the range of 0.1 to 0.2 to 0.4, 0.2 to 0.5, 0.3 to 0.6 or optionally 0.3 to 0.7. The semiconductor device may have a characteristic diameter greater than 1 cm, 2 cm, 3 cm, or optionally, 4 cm allowing for compatibility with full wafer size devices.

The step of removing the semiconductor device may be completed in less than 6 hours, 8 hours, 12 hours, 18 hours, or optionally, 24 hours. The nanochannel mask may be crystallographically patterned.

In an aspect, provided is a device for the growth of semiconductors comprising: a) a GaAs substrate; b) a nanochannel mask in physically communication with a first surface of the GaAs substrate; c) a $Al_xGa_{1-x}As$ sacrificial layer proximate to the first surface and comprising a plurality of nanochannels proximate to the nanochannel mask. The GaAs substrate and/or the nanochannel mask may be reusable.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMERALS

Figure 1:
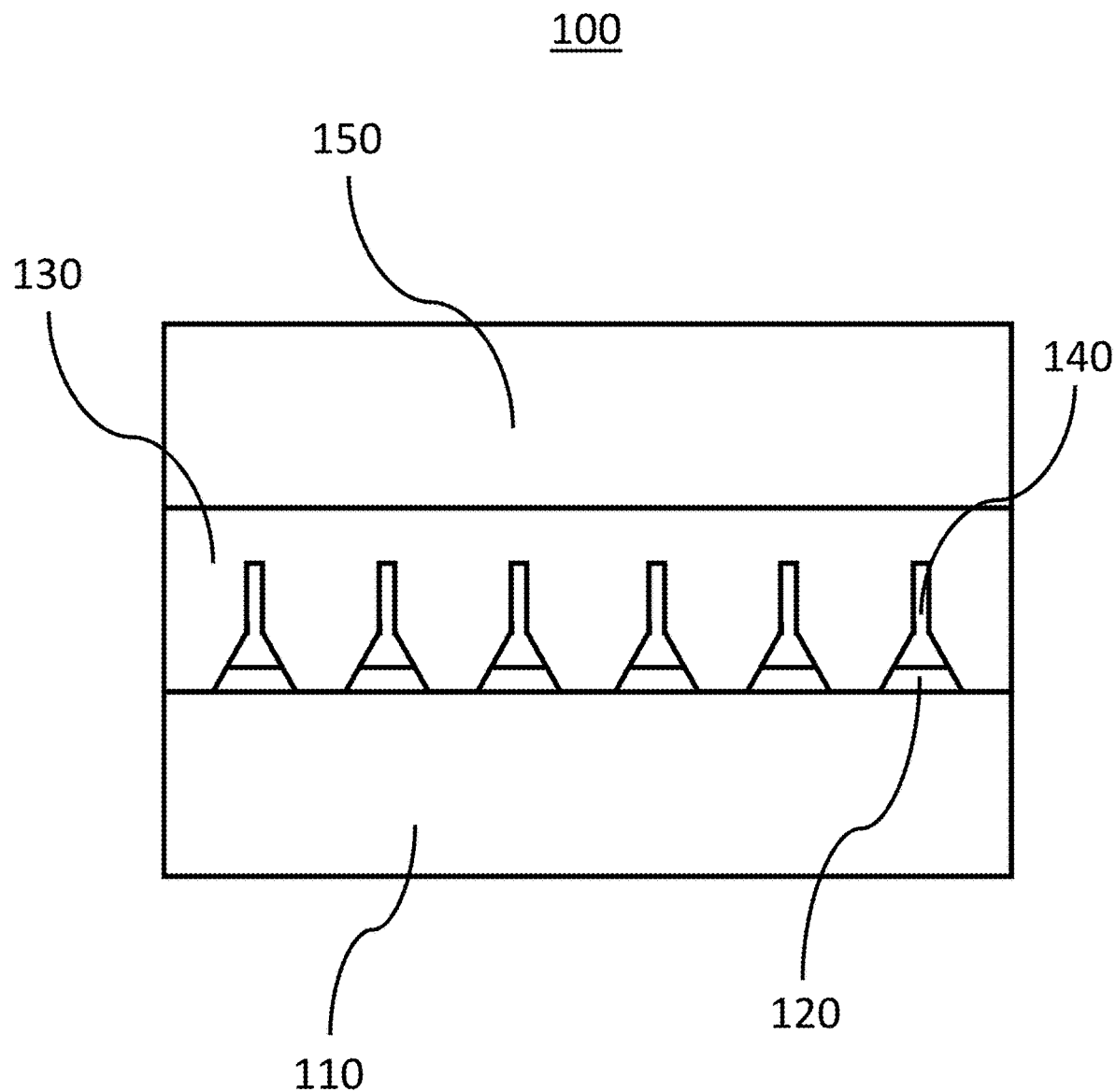
FIG. 1 illustrates an exemplary device for the growth of semiconductors, according to some embodiments of the present disclosure.

100 Device for the growth of semiconductors
110 GaAs Substrate
120 Nanochannel Mask
130 Sacrificial Layer
140 Nanochannels
150 Semiconductor

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Described herein and devices and methods to facilitate faster removal of semiconductor devices from growth substrates and allow for the reuse of the substrates to reduce costs. The present disclosure describes the generation of nanochannels through a sacrificial layer increases the rate of chemical etching by increasing the exposed surface area to the etchant as the semiconductor is being removed. The device may be utilized in advanced semiconductor technologies including GaAs or other semiconducting materials.

Figure 2:
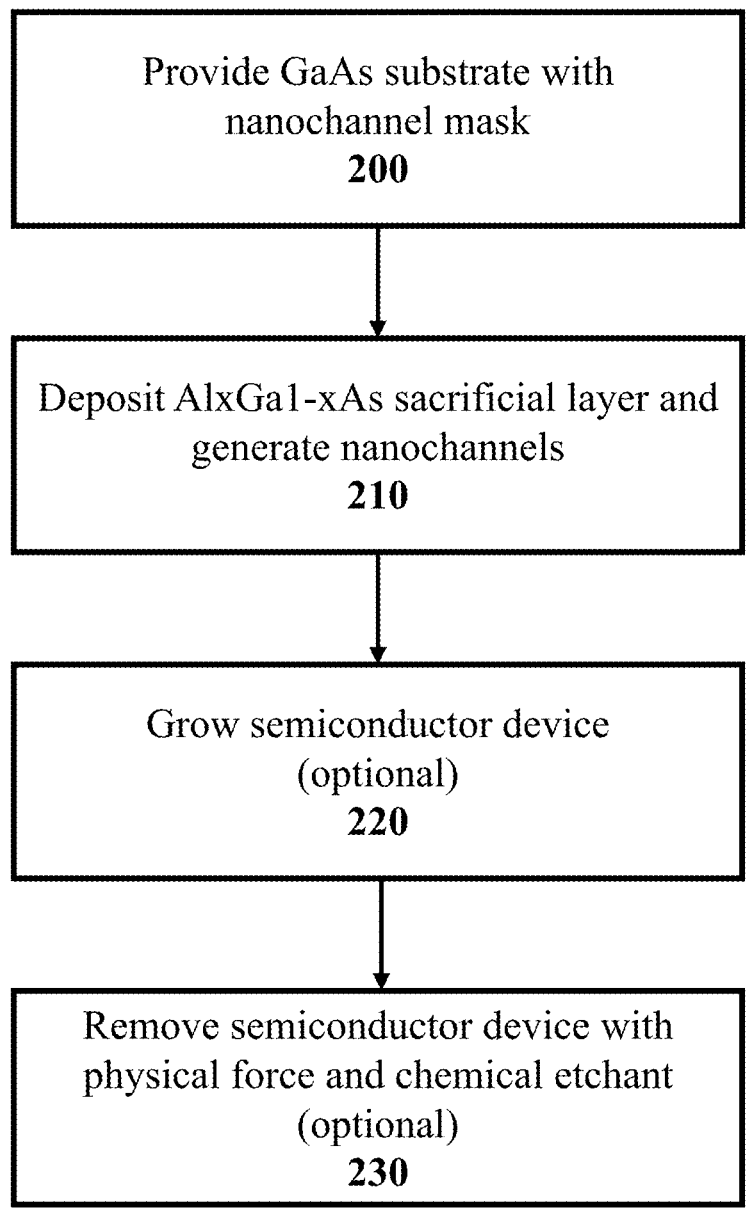
FIG. 2 illustrates an exemplary method of growing semiconductors as described herein.

An example device for the growth of semiconductors 100 as described herein is provided in FIG. 1. A nanochannel mask 120 is placed on the surface of a GaAs substrate 110. The nanochannel mask 120 may be crystallographically patterned. A sacrificial layer 130, for example $Al_xGa_{1-x}As$, can be grown on the surface of the substrate 110 with the nanochannel mask 120. By controlling the growth process and the properties of the nanochannel mask 120, nanochannels 140 of void space form in the sacrificial layer 120. The nanochannels 140 may have more advanced geometries than a simple triangle, such as the extended crack or rectangle from the top of the triangle as shown in FIG. 1. Advantageously, these geometries have increased exposed surface areas during the chemical etching process and may further increase the speed at which the sacrificial layer 120 is destroyed and a semiconductor 150 grown on the surface is removed. FIG. 2 provides an exemplary method as described herein.

The provided discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

Example 1—Patterned Nanochannel $Al_xGa_{1-x}As$ Release Layer for GaAs Substrate Reuse Described herein is the formation of nanochannel arrays produced during overgrowth and coalescence of GaAs and AlGaAs epilayers grown over patterned GaAs substrates (see FIG. 6). These nanochannels can be formed concurrent to the growth of a sacrificial layer (e.g., $Al_xGa_{1-x}As$) to significantly decrease the time required for sacrificial layer removal during the otherwise slow epitaxial lift-off process. This will, in turn, lead to a substantial increase in the economic viability of the epitaxial lift-off process for GaAs substrate reuse.

Epitaxial lift-off (ELO) using a grown-in sacrificial layer, typically AlAs, has been shown to be a promising technique for reuse of expensive GaAs substrates. However, one major drawback of the ELO process is long sacrificial layer etching times required for complete release of the epilayer from the substrate. Introducing a regular array of nanoscale channels throughout the sacrificial layer can significantly decrease the amount of etching time necessary for epitaxial lift-off by exposing orders of magnitude more surface area to the etchant compared to conventional processes. Furthermore, using an etching solution that is highly selective to the sacrificial layer material can return the patterned GaAs substrate surface to its original state for repeated growth after each ELO process.

Most conventional techniques for epitaxial lift-off introduce some type of strain to "peel off" the epilayer during the etching process in order to keep the etching solution in constant contact with the sacrificial layer. Examples of this include using a weight to aid in epilayer release or adding a strained layer atop the epilayer to cause it to curl up during the etching process. The systems and methods described herein would not require an additional strain to maintain etch rate but could potentially benefit further from utilization of these techniques.

The traditional epitaxial lift-off (ELO) process typically includes: 1) Growing a lattice-matched sacrificial layer on the substrate 2) growing a semiconductor device on top of the sacrificial layer 3) submerging the entire stack in chemical etchant to remove the sacrificial layer and 4) lifting off the device once the sacrificial layer is fully etched. The method allows for the substrate to be reused and the growth of layers is well understood. Further it has been shown experimentally and commercially with great success. However, the etch rate of the sacrificial layer is very slow (typically between 8 and 48 hours) and the etching products can leave detrimental residue and surface roughness on the semiconductor device.

In general, a physical force is applied to cause the grown layer to peel away from the substrate as etching proceeds to continuously expose additional surface area of the sacrificial layer to the chemical etchant. If force is not applied to peel back the epilayer film, the etching process is limited by the etch products blocking the interface between the sacrificial layer and the etchant.

Figure 3:
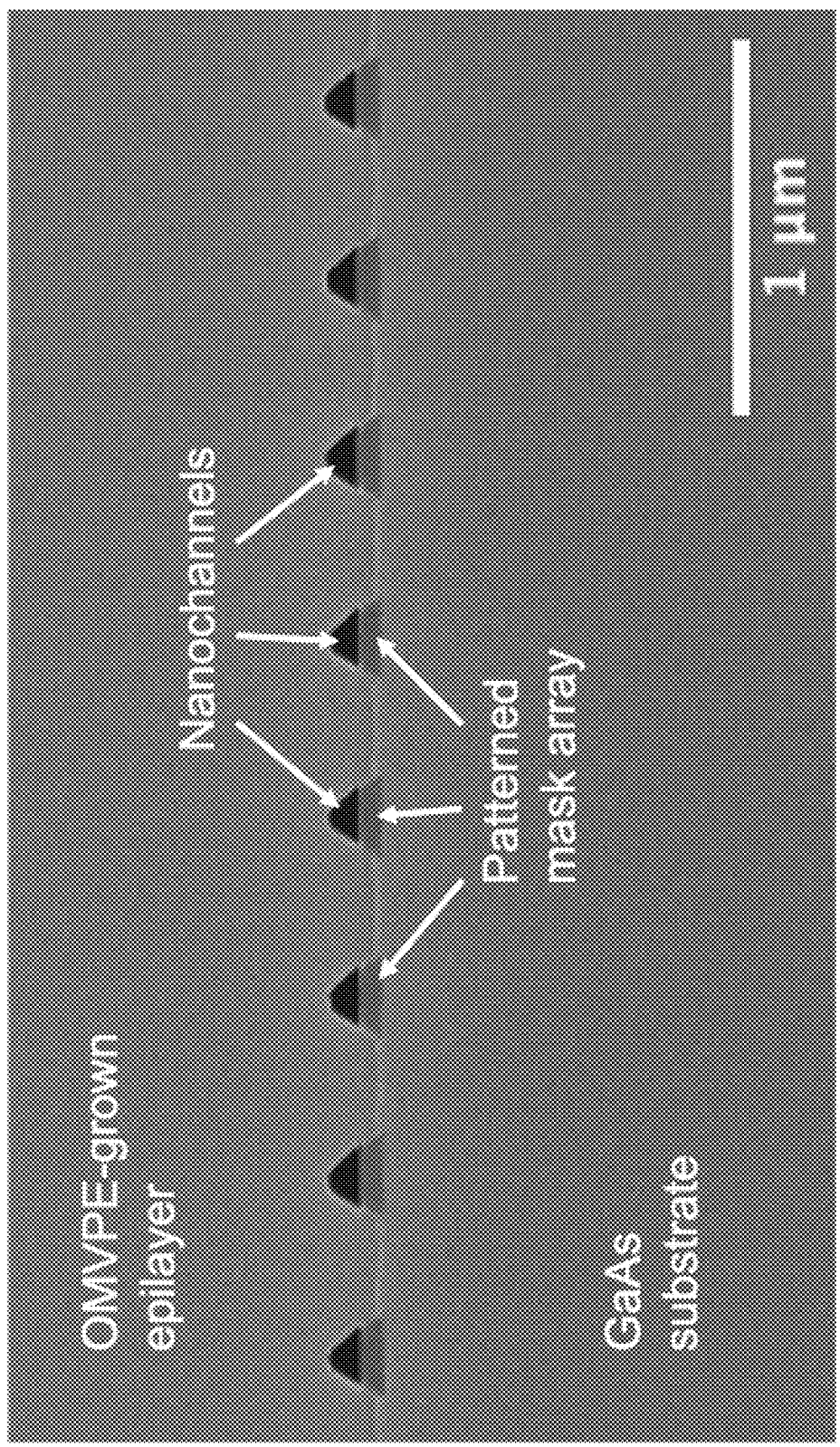
FIG. 3 provides an example of the nanochannels described herein.

Using a nano-patterned substrate, the sacrificial layer can be grown with built-in nanochannels to significantly increase surface area exposed to the etchant which decreases the time required for etching, as shown in FIG. 3. Furthermore, if the etchant used is selective to only the sacrificial layer, the substrate and pattern should be undamaged and available for reuse with minimal cleaning steps. The nanochannels are formed by placing long strips of mask material over the substrate, the sacrificial material grows in between the masked areas and overgrow the mask. Choosing specific crystallographic orientations of the mask with respect to the substrate, along with specific growth conditions, the epilayer material forms crystallographic facets as it grows over the mask. Certain facets will cause the epilayer material to grow vertically faster than it grows horizontally, thus creating an empty channel along the top of the mask material when two adjacent overgrowths come together. Using a periodic mask array will result in a periodic array of these channels (as seen in FIG. 3).

Figure 4:
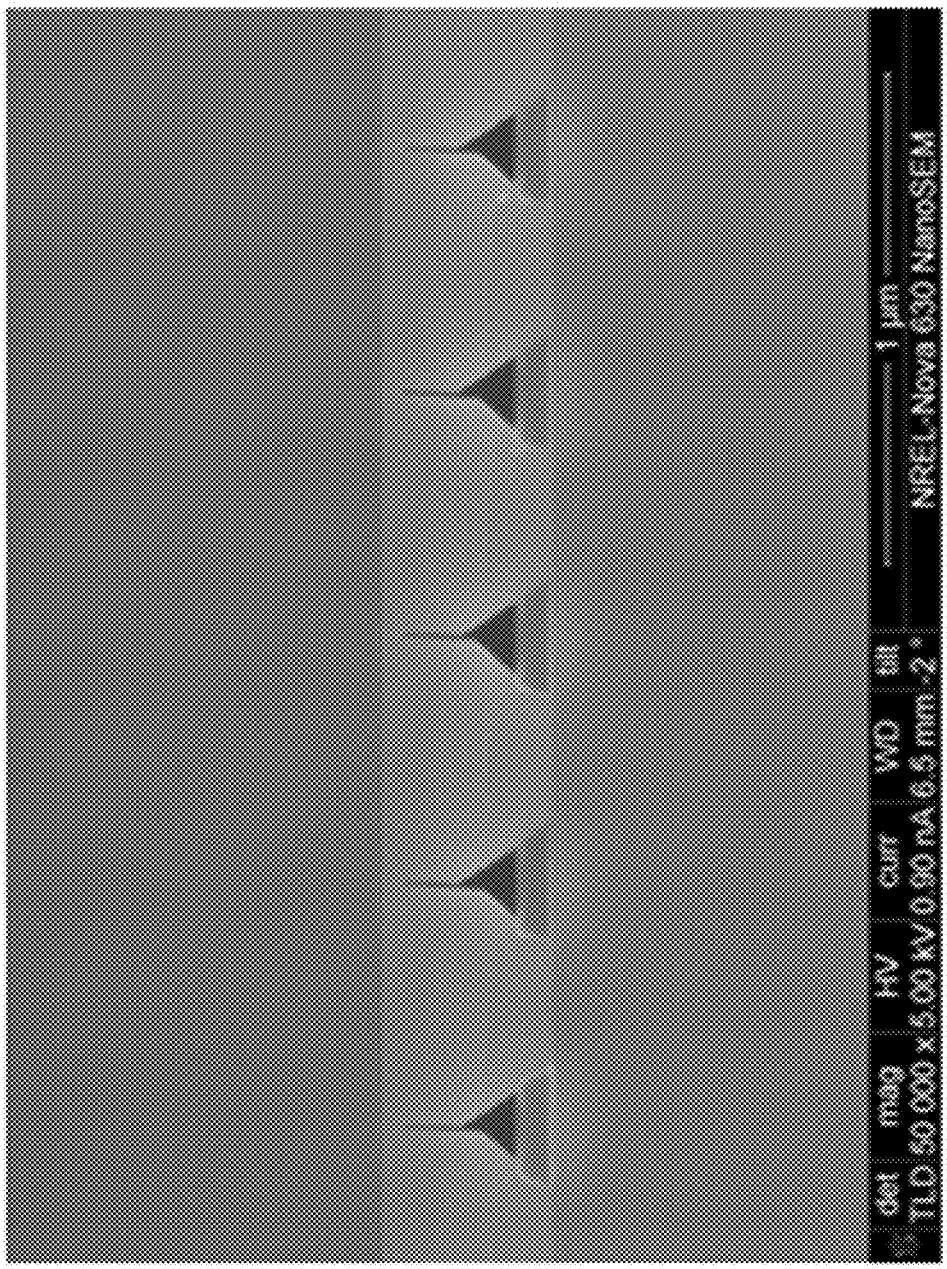
FIG. 4 provides an example of the nanochannels having a non-triangular geometry and increased surface area as described herein.

The size and shape of the channels can be manipulated by changing the sacrificial layer composition and the nanochannel mask properties, as illustrated in FIG. 4. In FIG. 4, the overgrowth started with GaAs and was switched to AlGaAs just before the GaAs overgrowths came together. You can see the same general channel shape as in FIG. 3 (which is fully GaAs), but when the composition was changed to AlGaAs, the vertical growth rate became much faster than the horizontal growth rate, creating the thin open slivers above the original channel formation. Starting the epilayer growth with AlGaAs will create tall vertical columns of sacrificial layer material, in turn creating tall vertical channels that should be more easily infiltrated with etchant.

The devices and methods described herein may be further understood by the following non-limiting examples:

Example 1. A method for generating a sacrificial layer for semiconductor production comprising:
providing a GaAs substrate having a nanochannel mask in physical communication with a surface; and
depositing a $Al_xGa_{1-x}As$ sacrificial material on the surface of the GaAs substrate, thereby generating a sacrificial layer comprising a plurality of nanochannels.

Example 2. The method of example 1 further comprising:
growing a semiconductor device on a first surface of the sacrificial layer; and
removing the semiconductor device by applying physical force to the semiconductor device and chemical etchant to the sacrificial layer, wherein the plurality of nanochannel increase a rate of chemical etching.

Example 3. The method of example 1 or 2, wherein the plurality of nanochannels have a characteristic height dimension greater than a characteristic width dimension.

Example 4. The method of example 3, wherein the characteristic vertical dimension is at least 1.5× greater than the characteristic width dimension.

Example 5. The method of example 3 or 4, wherein the characteristic width dimension is selected from the range of 50 nm to 500 nm.

Example 6. The method of any of examples 1-5, wherein the plurality of nanochannels increase a surface area of a second surface of the sacrificial layer by greater than 50% with respect to a flat surface not containing nanochannels.

Example 7. The method of any of examples 1-6, wherein x in the formula $Al_xGa_{1-x}As$ is selected from the range of 0.2 to 0.4.

Example 8. The method of any of examples 2-7, wherein the semiconductor device has a characteristic diameter greater than 2 cm.

Example 9. The method of example 8, wherein the step of removing the semiconductor device is completed in less than or equal to 24 hrs.

Example 10. The method of any of examples 1-9, wherein the nanochannel mask is crystallographically patterned.

Example 11. A device for the growth of semiconductors comprising:
a GaAs substrate;
a nanochannel mask in physically communication with a first surface of the GaAs substrate; and
a $Al_xGa_{1-x}As$ sacrificial layer proximate to the first surface and comprising a plurality of nanochannels proximate to the nanochannel mask.

Example 12. The device of example 11, wherein the plurality of nanochannels have a characteristic height dimension greater than a characteristic width dimension.

Example 13. The device of example 12, wherein the characteristic vertical dimension is at least 1.5× greater than the characteristic width dimension.

Example 14. The device of example 11 or 12, wherein the characteristic width dimension is selected from the range of 50 nm to 500 nm.

Example 15. The device of any of examples 11-14, wherein the plurality of channels increase a surface area of a second surface of the sacrificial layer by greater than 50% with respect to a flat surface not containing nanochannels.

Example 16. The device of any of examples 11-15, wherein x in the formula $Al_xGa_{1-x}As$ is selected from the range of 0.2 to 0.4.

Example 17. The device of any of examples 11-16, wherein the nanochannel mask is crystallographically patterned.

Example 18. The device of any of examples 11-17, wherein the GaAs substrate and/or the nanochannel mask is reusable.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. For example, when a device is set forth disclosing a range of materials, device components, and/or device configurations, the description is intended to include specific reference of each combination and/or variation corresponding to the disclosed range.

Every formulation or combination of components described or exemplified herein can be used to practice the invention, unless otherwise stated.

Whenever a range is given in the specification, for example, a density range, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter is claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A method for generating a sacrificial layer for semiconductor production comprising:
   providing a GaAs substrate having a nanochannel mask in contact with a surface; and
   depositing a $Al_xGa_{1-x}As$ sacrificial material on the surface of the GaAs substrate, thereby generating a sacrificial layer comprising a plurality of nanochannels,
   wherein the plurality of nanochannels have a shape consisting of a triangle with a crack extending from the top of the triangle.

2. The method of claim 1 further comprising:
   growing a semiconductor device on a first surface of the sacrificial layer; and
   removing the semiconductor device from the GaAs substrate by applying physical force to the semiconductor device and chemical etchant to the sacrificial layer, wherein the plurality of nanochannel increase a rate of chemical etching.

3. The method of claim 2, wherein the semiconductor device has a characteristic diameter greater than 2 cm.

4. The method of claim 3, wherein the step of removing the semiconductor device is completed in less than or equal to 12 hrs.

5. The method of claim 1, wherein the plurality of nanochannels have a height greater than a width.

6. The method of claim 5, wherein the height is at least 1.5× greater than the width.

7. The method of claim 5, wherein the width is selected from the range of 50 nm to 500 nm.

8. The method of claim 1, wherein x in the formula $Al_xGa_{1-x}As$ is selected from the range of 0.2 to 0.4.

9. The method of claim 1, wherein the nanochannel mask is crystallographically patterned.

10. A device for the growth of semiconductors comprising:
    a GaAs substrate;
    a nanochannel mask in contact with a first surface of the GaAs substrate; and
    a $Al_xGa_{1-x}As$ sacrificial layer proximate to the first surface and comprising a plurality of nanochannels proximate to the nanochannel mask,
    wherein the nanochannel mask forms a plurality of nanochannels have a shape consisting of a triangle with a crack extending from the top of the triangle.

11. The device of claim 10, wherein the plurality of nanochannels have a height greater than a width.

12. The device of claim 11, wherein the height is at least 1.5× greater than the width.

13. The device of claim 11, wherein the width is selected from the range of 50 nm to 500 nm.

14. The device of claim 10, wherein x in the formula $Al_xGa_{1-x}As$ is selected from the range of 0.2 to 0.4.

15. The device of claim 10, wherein the nanochannel mask is crystallographically patterned.

16. The device of claim 10, wherein the GaAs substrate and/or the nanochannel mask is reusable.

* * * * *